(12) United States Patent
Lee et al.

(10) Patent No.: US 11,887,866 B2
(45) Date of Patent: Jan. 30, 2024

(54) SUPERCRITICAL PROCESSING APPARATUS

(71) Applicant: SEMES CO., LTD., Cheonan-si (KR)

(72) Inventors: Jae Seong Lee, Hwaseong-si (KR); Hae Won Choi, Daejeon (KR); Ki Hoon Choi, Yongin-si (KR); Anton Koriakin, Cheonan-si (KR); Chan Young Heo, Hwaseong-si (KR); Do Heon Kim, Cheonan-si (KR); Ji Soo Jeon, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 578 days.

(21) Appl. No.: 16/657,983

(22) Filed: Oct. 18, 2019

(65) Prior Publication Data

US 2020/0126821 A1 Apr. 23, 2020

(30) Foreign Application Priority Data

Oct. 19, 2018 (KR) .................. 10-2018-0124960

(51) Int. Cl.
*H01L 21/67* (2006.01)
*B08B 3/04* (2006.01)

(52) U.S. Cl.
CPC .......... *H01L 21/67028* (2013.01); *B08B 3/04* (2013.01); *H01L 21/67126* (2013.01)

(58) Field of Classification Search
CPC ......... H01L 21/02041; H01L 21/02043; H01L 21/02052; H01L 21/02054; H01L 21/02101; H01L 21/67017; H01L 21/67023; H01L 21/67028; H01L 21/67034; H01L 21/6704; H01L 21/67057; H01L 21/6719; H01L 21/67027; B08B 7/0021
See application file for complete search history.

(56) References Cited

U.S. PATENT DOCUMENTS

| 6,946,399 | B1 * | 9/2005 | Lorimer | H01L 21/0209 |
| | | | | 438/704 |
| 2004/0123484 | A1 * | 7/2004 | Yoshikawa | B08B 7/0021 |
| | | | | 34/410 |
| 2012/0073599 | A1 * | 3/2012 | Miya | H01L 21/67034 |
| | | | | 134/4 |
| 2014/0262024 | A1 * | 9/2014 | Cho | H01L 21/67017 |
| | | | | 156/345.1 |

(Continued)

FOREIGN PATENT DOCUMENTS

| JP | 2000-340540 A | 12/2000 |
| KR | 10-2009-0016974 A | 2/2009 |

OTHER PUBLICATIONS

Office Action from China National Intellectual Property Administration dated Jan. 13, 2023.

*Primary Examiner* — David G Cormier

(57) ABSTRACT

A supercritical processing apparatus includes an upper vessel including a first fluid hole formed in a center thereof, and a lower vessel including a second fluid hole formed in a center thereof. A space is defined between the upper and lower vessels and configured to allow a substrate to be placed therein. The upper vessel further includes a first guide portion provided at a lower portion thereof to be gradually inclined downward toward a periphery thereof from the first fluid hole.

13 Claims, 8 Drawing Sheets

(56) References Cited

U.S. PATENT DOCUMENTS

2015/0176897 A1* 6/2015 Jun ................... H01L 21/67034
                                                    34/218
2015/0303036 A1* 10/2015 Jeong ................ H01J 37/32513
                                                    118/733
2016/0121374 A1   5/2016 Lee et al.

* cited by examiner

SUPERCRITICAL PROCESSING APPARATUS

CROSS REFERENCE TO RELATED APPLICATION

The present application claims priority under 35 U.S.C. § 119 to Korean Patent Application No. 10-2018-0124960, filed Oct. 19, 2018 in the Korean Intellectual Property Office, the disclosure of which is incorporated by reference in its entirety.

BACKGROUND OF THE INVENTION

Field of the Invention

The present invention relates to a supercritical processing apparatus for processing a substrate using a supercritical fluid.

Description of the Related Art

In general, integrated circuits are manufactured from substrates such as silicon wafers. Fabrication of integrated circuits includes formation of a fine circuit pattern on the surface of a substrate. The formation of the circuit pattern roughly includes processes of deposition, photolithography etching, and the like.

During such processes, various contaminants may be generated and adhered to the substrate surface on which the circuit pattern is formed. The contaminants may be removed from the substrate by employing supercritical processing.

One example of supercritical processing is as follows: the surface of a substrate is treated using a washing liquid, and a drying solution such as isopropyl alcohol (IPA). Then, a supercritical fluid such as carbon dioxide ($CO_2$) or the like is supplied to the substrate at a high pressure from a supercritical processing apparatus including a vessel, thus removing residual contaminants including IPA from the substrate.

FIG. 1 is a sectional view schematically showing a supercritical processing apparatus according to the related art.

Referring to FIG. 1, a supercritical processing apparatus according to the related art is configured such that a substrate W to be subjected to supercritical processing is provided in a space S defined between an upper vessel 10 and a lower vessel 20. The upper vessel 10 includes a first fluid hole 11 formed in the center thereof, and the lower vessel 20 includes a second fluid hole 21 formed in the center thereof. These fluid holes provide flow channels for a supercritical fluid to be introduced into or discharged from the vessels.

A predetermined gap between a lower surface of the upper vessel 10 and the substrate W defines a flow channel. The supercritical fluid is introduced from the first fluid hole 11 having a relatively small diameter to be supplied to an upper surface of the substrate W at a high pressure through this flow channel. In this case, sudden pressure and temperature changes may occur in a central region of the substrate W corresponding to a location of the first fluid hole 11, which may cause pattern leaning. In addition, a difference in flow velocity of the supercritical fluid may occur between the central region of the substrate W and a peripheral region thereof. Such a difference in the flow velocity of the supercritical fluid may lead to a temperature deviation in each region of the substrate W. As a result, process unevenness may be caused in each region of the substrate W.

Furthermore, when the supercritical fluid is introduced from the second fluid hole 21 of the lower vessel 20, the temperature of the fluid may concentrate in a central region of a lower surface of the substrate W, which may cause a temperature deviation between the central region of the substrate W and the peripheral region thereof and cause process unevenness in each region of the substrate.

Furthermore, during a process, turbulence may occur in a predetermined region of the space S, for example, a region corresponding to the peripheral region of the substrate W. The turbulence may cause removed particles to be re-attached to the substrate W, which may cause process defects.

Furthermore, when the supercritical fluid is discharged through the second fluid hole 21 of the lower vessel 20, turbulence may also occur in a space below the substrate W, and thus, an efficient flow of fluid may not be achieved.

The foregoing is intended merely to aid in the understanding of the background of the present invention, and is not intended to mean that the present invention falls within the purview of the related art that is already known to those skilled in the art.

DOCUMENTS OF RELATED ART (Patent document 1) Korean Patent Application Publication No. 10-2009-0016974

SUMMARY OF THE INVENTION

Accordingly, the present invention has been made keeping in mind the above problems occurring in the related art, and an objective of the present invention is to provide a supercritical processing apparatus capable of stably supplying or discharging a supercritical fluid by employing an internal structure of a vessel, which is designed in consideration of flow of the supercritical fluid.

Another objective of the present invention is to provide a supercritical processing apparatus capable of minimizing occurrence of re-attachment of removed particles present inside a vessel to a substrate during a process.

Objectives of the present invention are not limited to the above objectives, and other objectives and advantages of the present invention which are not mentioned may be understood by the following description.

In order to achieve the above objective, according to one aspect of the present invention, there is provided a supercritical processing apparatus, including: a vessel comprised of an upper vessel including a first fluid hole formed in a center thereof, and a lower vessel including a second fluid hole formed in a center thereof; and a space defined between the upper and lower vessels and configured to allow a substrate to be placed therein, wherein the upper vessel further includes a first guide portion provided at a lower portion thereof to be gradually inclined downward toward a periphery thereof from the first fluid hole.

In an embodiment of the present invention, a width between the upper vessel and the substrate may gradually decrease from a central region of the substrate toward a peripheral region thereof, and a fluid may flow at the same flow velocity in the center region of the substrate and in the peripheral region thereof.

In an embodiment of the present invention, the upper vessel may further include a first stepped portion provided on a lower surface thereof so as to protrude downward, and the first stepped portion may be larger in diameter than the substrate.

In an embodiment of the present invention, the lower vessel may further include a second guide portion provided at an upper portion thereof to be gradually inclined upward toward a periphery thereof from the second fluid hole.

In an embodiment of the present invention, the supercritical processing apparatus may further include a sealing member interposed between the upper and lower vessels, and sealing a gap between the upper and lower vessels.

In an embodiment of the present invention, the lower vessel may further include a second stepped portion protruding upward, and the sealing member may be provided on the second stepped portion.

According to another aspect of the present invention, there is provided a supercritical processing apparatus, including: a vessel comprised of an upper vessel including a first fluid hole formed in a center thereof, and a lower vessel including a second fluid hole formed in a center thereof; and a space defined between the upper and lower vessels and configured to allow a substrate to be placed therein, wherein the lower vessel further includes a second guide portion provided at an upper portion thereof to be gradually inclined upward toward a periphery thereof from the second fluid hole.

In an embodiment of the present invention, the upper vessel may further include a first guide portion provided at a lower portion thereof to be gradually inclined downward toward a periphery thereof from the first fluid hole.

According to still another aspect of the present invention, there is provided a supercritical processing apparatus, including: a vessel comprised of an upper vessel including a first fluid hole formed in a center thereof, and a lower vessel including a second fluid hole formed in a center thereof; and a space defined between the upper and lower vessels and configured to allow a substrate to be placed therein, wherein the upper vessel further includes a first guide portion provided at a lower portion thereof to be gradually inclined downward toward a periphery thereof from the first fluid hole, and the lower vessel further includes a second guide portion provided at an upper portion thereof to be gradually inclined upward toward a periphery thereof from the second fluid hole.

According to the embodiments of the present invention, due to the configuration in which the width of a flow channel is varied in a radial direction from either of an inlet and an outlet of the supercritical fluid, there is provided an effect of minimizing damage such as pattern leaning occurring at the center of a substrate due to sudden pressure and temperature changes, and of increasing reaction uniformity of fluid in an upper region of the substrate.

Furthermore, due to the provision of the stepped portion that is provided on the lower surface of the upper vessel at a location outside the substrate, there is provided an effect of preventing removed particles from being re-attached to the substrate due to turbulence generated around the peripheral region of the substrate.

Effects of the present invention is not limited to the above effects, and it should be understood that the effects of the present invention include all effects that can be inferred from the configuration of the invention described in the detailed description of the invention or the appended claims.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

Figure 1:
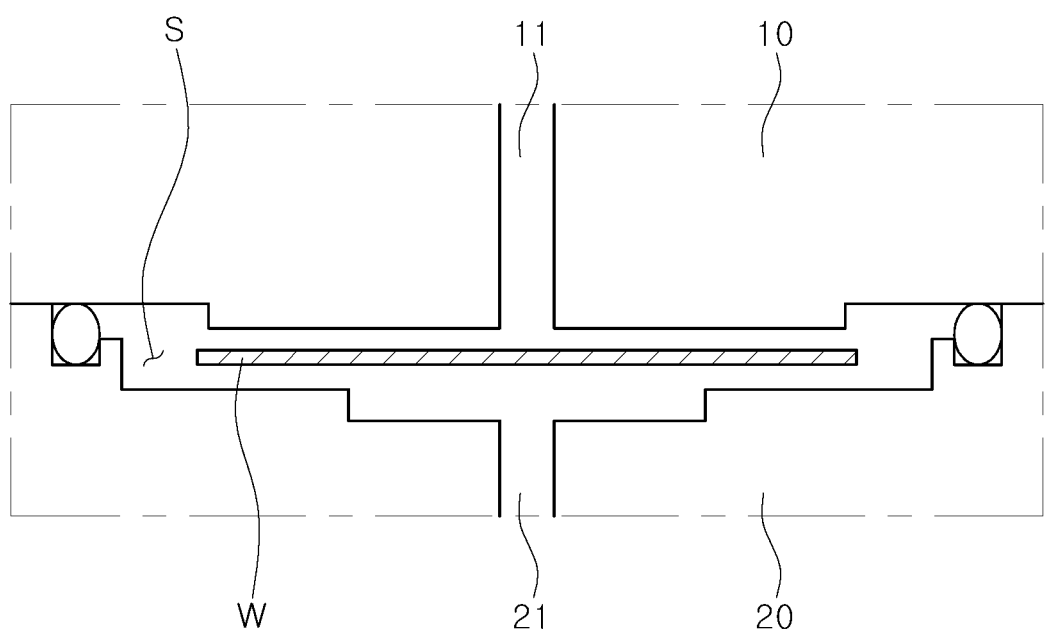
FIG. 1 is a sectional view schematically showing a supercritical processing apparatus according to the related art.

Hereinbelow, exemplary embodiments of the present invention will be described in detail with reference to the accompanying drawings. It should be understood that the embodiments may be changed to a variety of embodiments and the scope and spirit of the invention are not limited to the embodiments described hereinbelow.

In the following description, it is to be noted that, when the functions of conventional elements and the detailed description of elements related with the present invention may make the gist of the present invention unclear, a detailed description of those elements will be omitted. Wherever possible, the same reference numerals will be used throughout the drawings and the description to refer to the same or like elements or parts.

It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. The terminology used herein is for the purpose of describing particular embodiments only and is not intended to be limiting. Unless otherwise defined, all terms including technical and scientific terms used herein have the same meaning as commonly understood by one of ordinary skill in the art to which this invention belongs.

Figure 2:
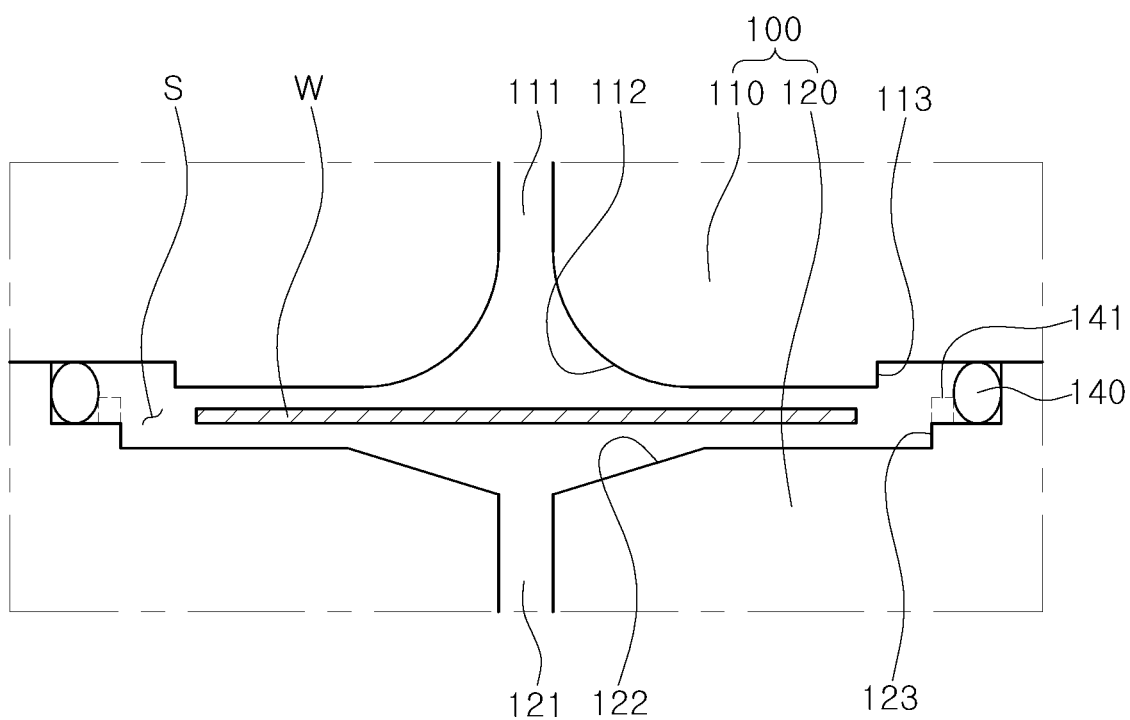
FIG. 2 is a sectional view schematically showing a supercritical processing apparatus according to an embodiment of the present invention.

FIG. 2 is a sectional view schematically showing a supercritical processing apparatus according to an embodiment of the present invention.

Referring to FIG. 2, a supercritical processing apparatus according to an embodiment includes a vessel 100 accommodating a substrate W therein.

The vessel 100 includes an upper vessel 110 and a lower vessel 120. A predetermined space S is defined between the upper vessel 110 and the lower vessel 120. The substrate W is placed in the space S between the upper vessel 110 and the lower vessel 120.

The upper vessel 110 includes a first fluid hole 111 formed in the center thereof in a vertical direction, and a first guide portion 112 provided at a lower portion thereof to guide the flow of a supercritical fluid in a radial direction.

The first fluid hole 111 may serve as an inlet through which the supercritical fluid is introduced into the vessel 100. The supercritical fluid may be introduced into the vessel 100 through the first fluid hole 111 to be supplied onto an upper surface of the substrate W on which a pattern is formed.

The upper vessel 110 includes a first stepped portion 113 provided on a lower surface thereof so as to protrude downward. The first stepped portion 113 serves to minimize occurrence of re-attachment of removed particles to the substrate W due to turbulence occurring in a peripheral region of the substrate W.

The lower vessel 120 includes a second fluid hole 121 formed in the center thereof in a vertical direction, and a second guide portion 122 provided at an upper portion thereof to guide the flow of a supercritical fluid in a radial direction.

The second fluid hole 121 may serve as an inlet through which the supercritical fluid is introduced into the vessel 100, together with the first fluid hole 111, or may serve as an outlet through which the supercritical fluid is discharged out of the vessel 100. The supercritical fluid may be introduced into the vessel 100 through the second fluid hole 121, move to a peripheral region of a lower surface of the substrate W, and be discharged out of the vessel 100 through the second fluid hole 121.

On the other hand, although the second fluid hole 121 serves as both an inlet and an outlet in one embodiment, the second fluid hole 121 may serve as only an outlet. Alternatively, an inlet and an outlet may be individually formed in a lower vessel 120 at respective locations.

A guide member may be disposed in the space S between the upper vessel 110 and the lower vessel 120. The guide member may serve as a supporter for the substrate and reduce the volume of chemical by reducing the volume of the space S.

The lower vessel 120 includes a second stepped portion 123 provided at a peripheral edge thereof so as to protrude upward. A sealing member 140 is disposed on the second stepped portion 123. The sealing member 140 is interposed between the upper vessel 110 and the lower vessel 120 to seal an interior of the vessel 100 during a process. The sealing member 140 includes a sealing guide 141 such that the sealing member is stably disposed on the second stepped portion 123 of the lower vessel 120 by the sealing guide.

The supercritical processing apparatus according to the embodiment of the present invention will be described in more detail as follows.

Figure 3:
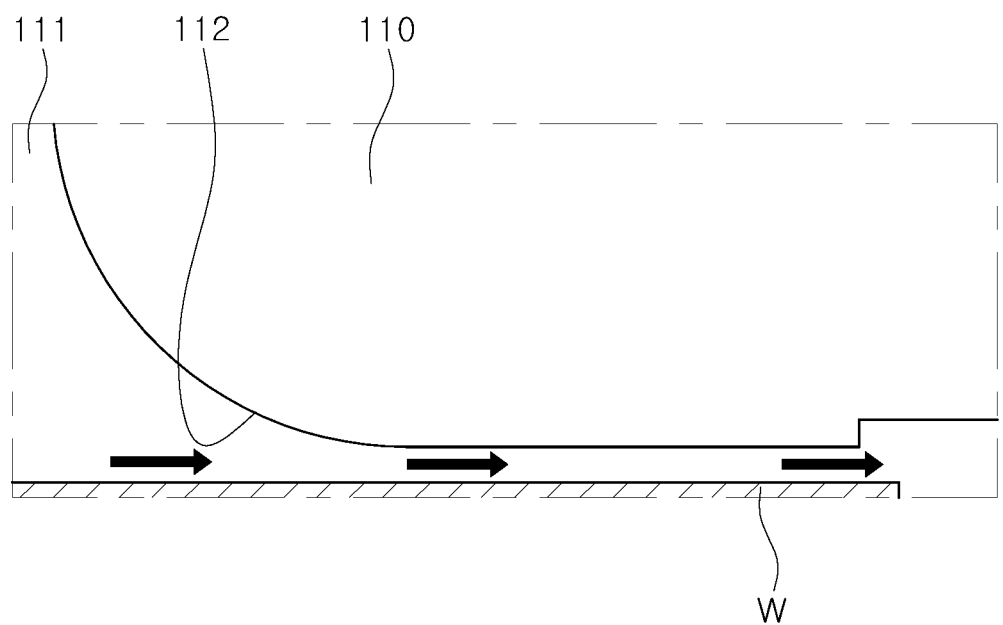
FIG. 3 is a view showing in detail a flow channel between an upper vessel and a substrate of FIG. 2.

Referring to FIG. 3, in one embodiment, the first guide portion 112 is provided at the lower portion of the upper vessel 110 to guide the flow of the supercritical fluid.

The first guide portion 112 may be formed to be gradually inclined downward toward the periphery of the lower surface of the upper vessel 110 from the center of the lower surface of the upper vessel 110, for example, from a lower end of the first fluid hole 111. The first guide portion 112 may be provided as a curved surface having a predetermined curvature or as a discontinuous inclined surface.

This configuration is to provide a flow channel defined in the space S at a location between the substrate W and the lower surface of the upper vessel 110 such that the supercritical fluid introduced from the first fluid hole 111 flows through the flow channel. Herein, the flow channel between the substrate W and the lower surface of the upper vessel 110 is varied in width along the length thereof to provide the substantially same flow velocity of the fluid in a central region of the substrate W and in a peripheral region thereof. In detail, the first guide portion 112 of the upper vessel 110 is formed to be gradually inclined downward such that the width of the flow channel gradually decreases from the central region of the substrate W toward the peripheral region thereof.

Due to provision of the first guide portion configured as described above, it is ensured that influence of the central region of the substrate W is reduced during a process carried out under conditions where sudden pressure and temperature changes occur. It is further ensured that flow uniformity of the fluid flowing in an upper region of the substrate W is increased, and thus mixing and reaction uniformity of the fluid is also increased.

Figure 4:
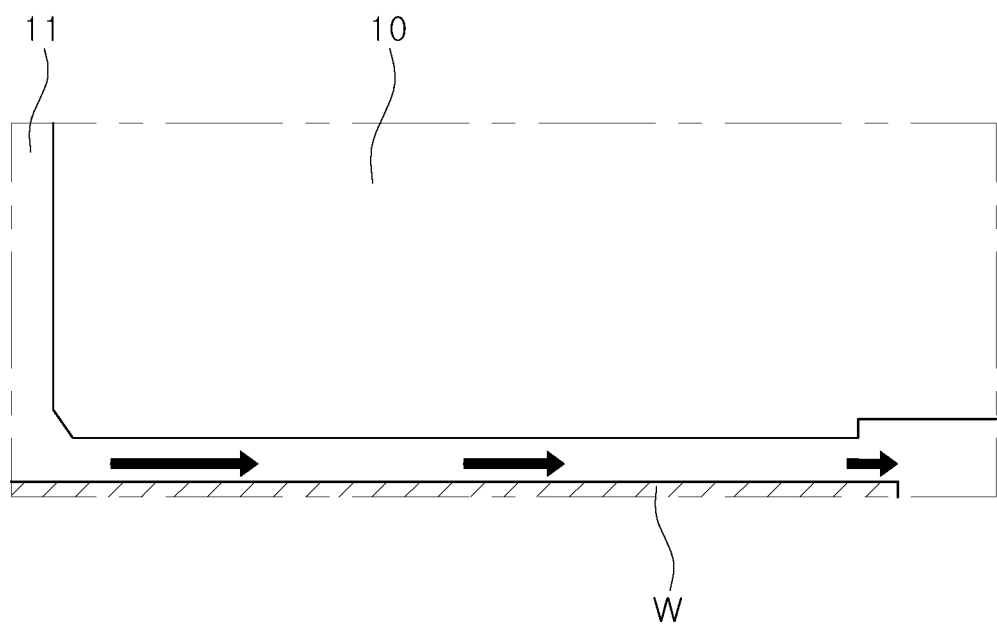
FIG. 4 is a view showing a comparative example with respect to FIG. 3.

Referring to FIG. 4, in a comparative example, a first fluid hole 11 is vertically formed with a constant diameter, and a flow channel defined between the lower surface of an upper vessel 10 and a substrate W is constant in width. In this case, a relatively narrow inlet is formed compared to the substrate size, which may cause a sudden change in pressure and temperature to occur in the central region of the substrate W. This may result in damage such as leaning occurring in a pattern formed in the central region of the substrate W.

In addition, since the width of the flow channel between the lower surface of the upper vessel 10 and the substrate W is constant, the flow velocity of the fluid flowing in the central region of the substrate W corresponding to the location of the first fluid hole 11 is faster than the flow velocity of the fluid flowing in the peripheral region of the substrate W. That is, the constant width of the flow channel may cause a large difference in the flow velocity between the central region of the substrate W and the peripheral region thereof, leading to a large temperature deviation between the central region of the substrate and the peripheral region thereof. This may result in the reaction uniformity of the fluid being relatively lowered.

Figure 5:
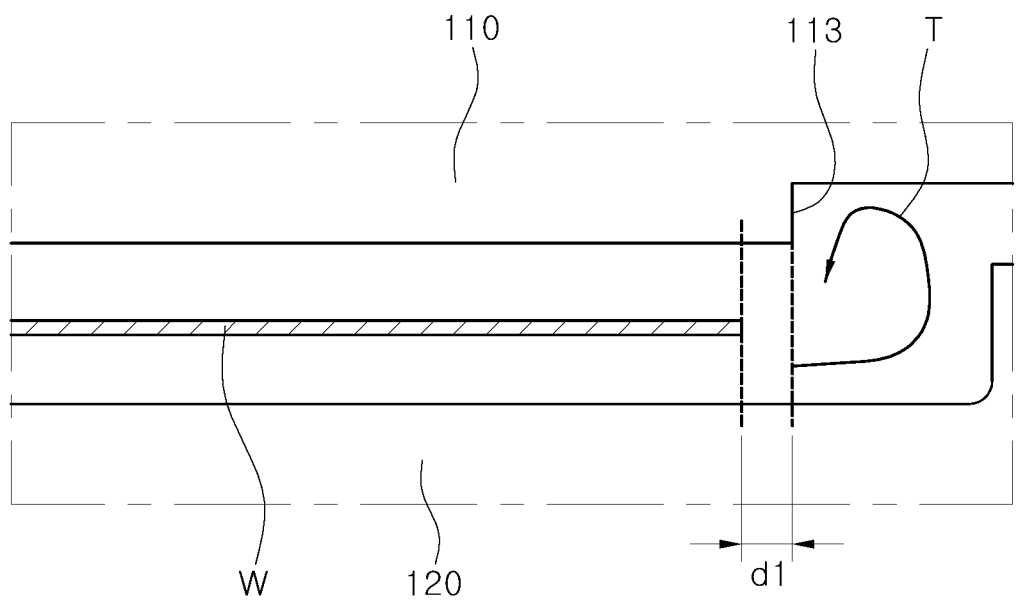
FIG. 5 is a view showing in detail a stepped portion of the upper vessel of FIG. 2.

Referring to FIG. 5, in one embodiment, the first stepped portion 113 is provided on the lower surface of the upper vessel 110 so as to protrude in a downward direction, that is, in a direction toward the substrate W.

When the first stepped portion 113 is not provided on the lower surface of the upper vessel 110, turbulence T may be generated around the substrate W, and removed particles may be re-attached to the substrate W due to the turbulence.

Therefore, due to the provision of the first stepped portion 113 formed on the lower surface of the upper vessel 110, it is ensured that even when the turbulence T is generated around the substrate W, occurrence of re-attachment of removed particles to the substrate W is minimized.

Herein, it is preferable that the first stepped portion 113 is larger in radius (or diameter) than the substrate W by a predetermined length d1, such that the first stepped portion is located outside the substrate.

Figure 6:
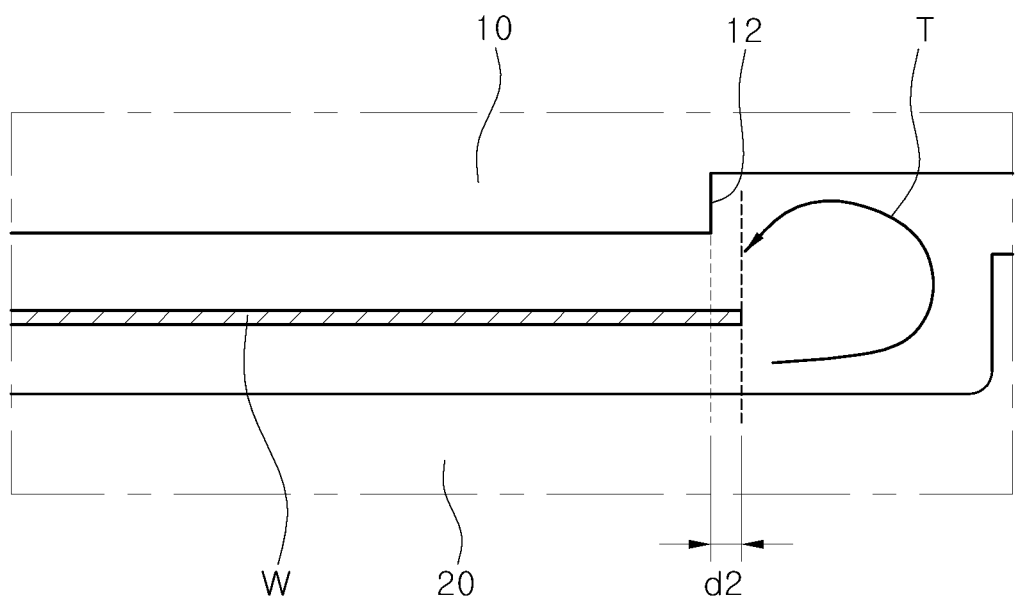
FIG. 6 is a view showing a comparative example with respect to FIG. 5.

Referring to a comparative example shown in FIG. 6, this is because when a first stepped portion 12 is provided on a lower surface of an upper vessel 10 and the first stepped portion 12 is smaller in radius than a substrate W by a predetermined length d2, turbulence T generated around the substrate W may not interfere with the first stepped portion 12 and thus removed particles may be re-attached to a peripheral region of the substrate W.

Therefore, due to the configuration of the first stepped portion 113 formed to be larger in the radius than the substrate W as in one embodiment, it is ensured that even when the turbulence T is generated around the substrate W, the turbulence T desirably interferes with the first stepped portion 113 located outside the substrate W and thus has less influence on the substrate W. This therefore provides an effect of minimizing occurrence of re-attachment of removed particles around the substrate W to the substrate W due to the turbulence.

Figure 7:
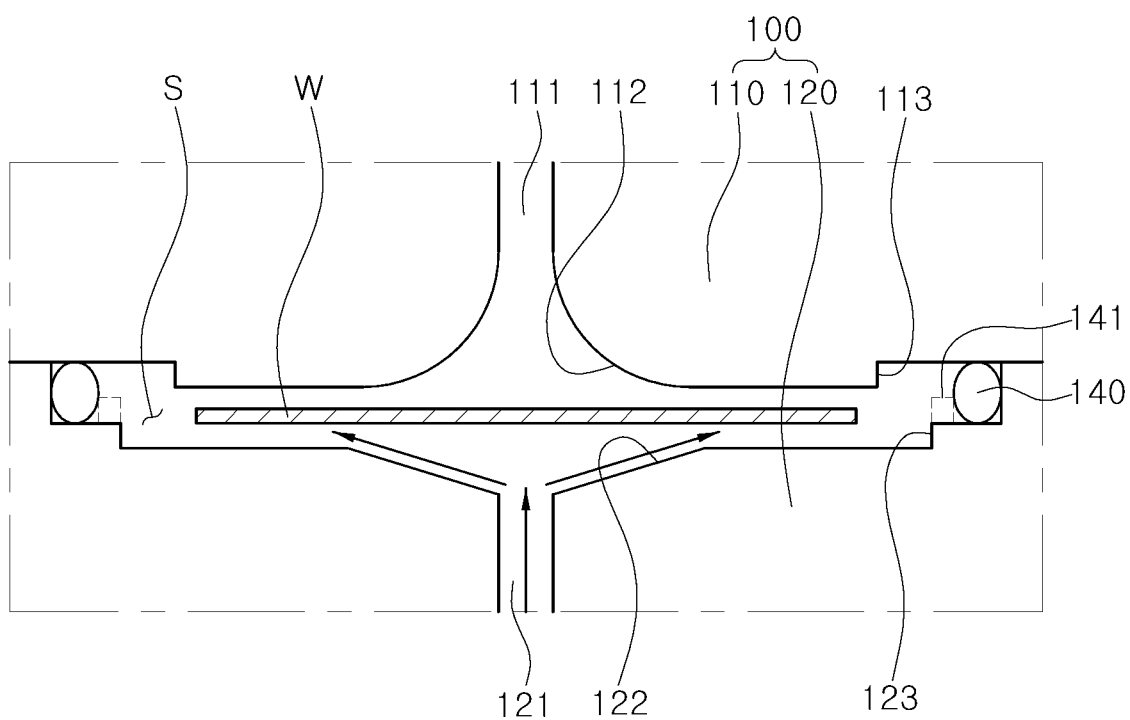
FIG. 7 is a view showing a flow channel when a fluid is introduced into the lower vessel of FIG. 2.

Referring to FIG. 7, in one embodiment, a space S is defined between an upper vessel 110 and a lower vessel 120 and is configured to allow a substrate W to be placed therein.

The lower vessel 120 includes a second guide portion 122 to guide the flow of a supercritical fluid. The second guide portion 122 may be formed to be gradually inclined upward from a lower end of a second fluid hole 121 to a predetermined point located on an upper surface of the lower vessel 120.

This configuration allows the supercritical fluid introduced from the second fluid hole 121 to be guided to move toward the peripheral portion of the substrate W through a flow channel defined between the second guide portion 122 of the lower vessel 120 and the substrate W.

Therefore, there is provided an effect that an efficient flow of the fluid is promoted to thereby prevent a sudden temperature change of the substrate W during a process, and that a temperature deviation between a central region of the substrate W and a peripheral region thereof is minimized.

Figure 8:
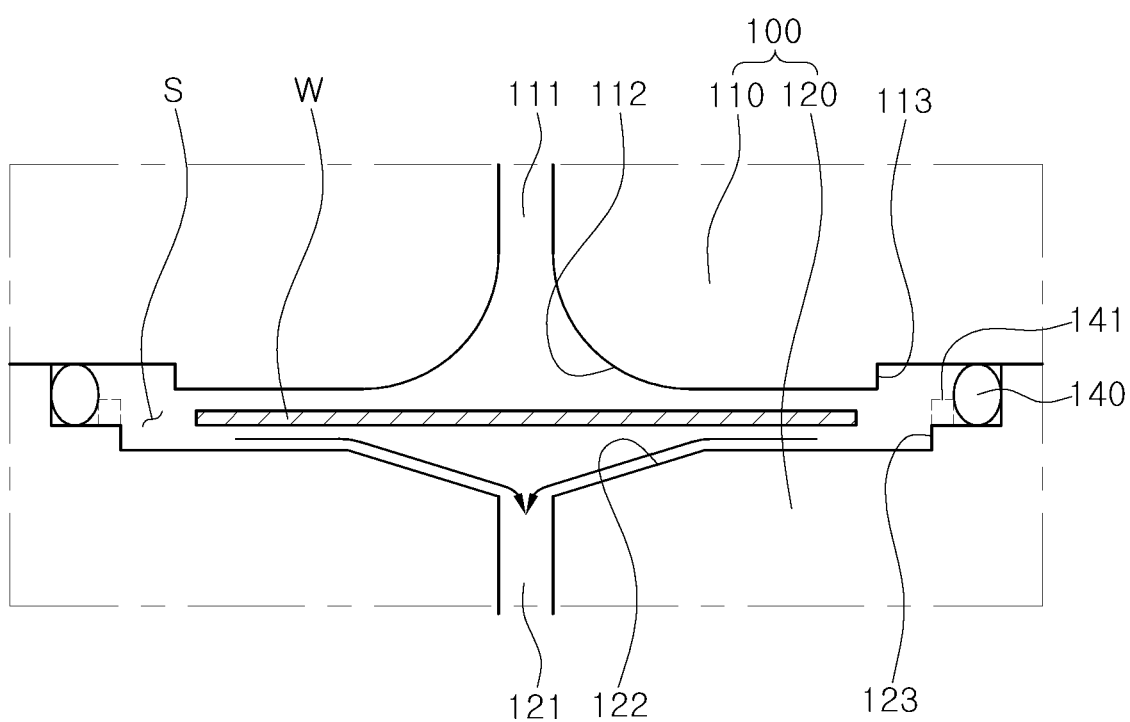
FIG. 8 is a view showing a flow channel when the fluid is discharged from the lower vessel of FIG. 2.

On the other hand, as shown in FIG. 8, when the second fluid hole 121 of the lower vessel 120 serves as an outlet, fluid and contaminants present inside the vessels are guided by a flow channel defined between the second guide portion 122 of the lower vessel 120 and the substrate W, which maintain a predetermined gap at a predetermined angle, such that fluid and contaminants are stably discharged through the second fluid hole 121.

Those who are ordinarily skilled in the art will appreciate that various alternatives, modifications, and equivalents are possible, without changing the spirit or essential features of the present invention. Therefore, exemplary embodiments of the present invention have been described for illustrative purposes, and should not be construed as being restrictive.

The scope of the present invention is defined by the accompanying claims rather than the description which is presented above. Moreover, the present invention is intended to cover not only the exemplary embodiments, but also various alternatives, modifications, equivalents and other embodiments that may be included within the spirit and scope of the present invention as defined by the appended claims.

What is claimed is:

1. A supercritical processing apparatus for processing a substrate using a supercritical fluid, comprising:
 a vessel comprised of an upper vessel including a first fluid hole formed in a center thereof, and a lower vessel including a second fluid hole formed in a center thereof, wherein the supercritical fluid flows via the first fluid hole and the second fluid hole; and
 a space defined between a lower surface of the upper vessel and an upper surface of lower vessel and configured to allow the substrate to be placed therein,
 wherein the upper vessel further includes a first guide portion provided at a lower portion thereof to be gradually inclined downward toward a periphery thereof from the first fluid hole,
 wherein the supercritical fluid flows along the first guide portion,
 wherein the lower surface of the upper vessel includes a first lower horizontal surface, a second lower horizontal surface, and a vertical side surface connecting the first horizontal lower surface to the second lower horizontal surface, wherein the second lower horizontal surface of the upper vessel is lower than the first lower horizontal surface of the upper vessel,
 wherein a portion of an interior surface of the upper and lower vessels that are engaged with each other is an uppermost upper horizontal surface of the lower vessel and is lower than the second lower horizontal surface of the upper vessel, and
 wherein the first lower horizontal surface, the second lower horizontal surface and the vertical side surface connected with other to form a first stepped portion of the upper vessel, and
 wherein when viewed in a plan view, the vertical side surface is located outside of a periphery of the substrate.

2. The supercritical processing apparatus of claim 1, wherein a width between the upper vessel and the substrate gradually decreases from a central region of the substrate toward a peripheral region thereof.

3. The supercritical processing apparatus of claim 1, wherein a fluid flows at the same flow velocity in a center region of the substrate and in a peripheral region thereof.

4. The supercritical processing apparatus of claim 1, wherein the lower vessel further includes a second guide portion provided at an upper portion thereof to be gradually inclined upward toward a periphery thereof from the second fluid hole, and
 wherein the supercritical fluid flows along the second guide portion, and
 wherein the second guide portion is directly connected to the second fluid hole.

5. The supercritical processing apparatus of claim 4, wherein the second guide portion is symmetric with reference to the second fluid hole.

6. The supercritical processing apparatus of claim 1, further comprising:
 a seal interposed between the lower surface of the upper vessel and the upper surface of the lower vessel, and sealing a gap between the upper vessel and the lower vessel.

7. The supercritical processing apparatus of claim 6, wherein the upper surface of the lower vessel includes at least two upper horizontal surfaces,
 wherein the uppermost upper horizontal surface has a recess, a bottom surface of the recess being between the uppermost upper horizontal surface and an upper horizontal surface immediately adjacent thereto, and
 wherein the seal is provided in the recess of the uppermost upper horizontal surface.

8. The supercritical processing apparatus of claim 6, wherein an upper surface of the lower vessel includes a first upper sloped surface, a second upper horizontal surface, a third upper horizontal surface, a first vertical side surface, and a second vertical side surface,
 wherein the third upper horizontal surface corresponds to the uppermost upper horizontal surface of the lower vessel,
 wherein the first upper sloped surface connects an end of the second fluid hole to the second upper horizontal surface,
 wherein the first vertical side surface connects the second upper horizontal surface to the third upper horizontal surface,
 wherein the second vertical side surface connects the third upper horizontal surface to the lower surface of the upper vessel, and wherein the seal is disposed in a region defined by the third upper horizontal surface, the lower surface of the upper vessel, and the second vertical side surface.

9. The supercritical processing apparatus of claim 7, wherein a vertical thickness of the seal is greater than a depth of the recess of the uppermost upper horizontal surface of the lower vessel.

10. The supercritical processing apparatus of claim 1, wherein the first fluid hole is vertically aligned with the second fluid hole.

11. The supercritical processing apparatus of claim 1, wherein the first guide portion is directly connected to the first fluid hole.

12. A supercritical processing apparatus for processing a substrate using a supercritical fluid, comprising:
a vessel comprised of an upper vessel including a first fluid hole formed in a center thereof, and a lower vessel including a second fluid hole formed in a center thereof, wherein the supercritical fluid flows via the first fluid hole and the second fluid hole; and
a space defined between a lower surface of the upper vessel and an upper surface of the lower vessel and configured to allow the substrate to be placed therein,
wherein the lower vessel further includes a second guide portion provided at an upper portion thereof to be gradually inclined upward toward a periphery thereof from the second fluid hole,
wherein the supercritical fluid flows along the second guide portion,
wherein the lower surface of the upper vessel includes a first lower horizontal surface, a second lower horizontal surface, and a vertical side surface connecting the first horizontal lower surface to the second lower horizontal surface,
wherein the second lower horizontal surface of the upper vessel is lower than the first lower horizontal surface of the upper vessel,
wherein a portion of an interior surface of the upper and lower vessels that are engaged with each other is an uppermost upper horizontal surface of the lower vessel and is lower than the second lower horizontal surface of the upper vessel,
wherein the first lower horizontal surface, the second lower horizontal surface and the vertical side surface connected with other to form a first stepped portion of the upper vessel, and
wherein when viewed in a plan view, the vertical side surface is located outside of a periphery of the substrate.

13. A supercritical processing apparatus for processing a substrate using a supercritical fluid, comprising:
a vessel comprised of an upper vessel including a first fluid hole formed in a center thereof, and a lower vessel including a second fluid hole formed in a center thereof, wherein the supercritical fluid flows via the first fluid hole and the second fluid hole; and
a space defined between a lower surface of the upper vessel and an upper surface of the lower vessel and configured to allow the substrate to be placed therein,
wherein the upper vessel further includes a first guide portion provided at a lower portion thereof to be gradually inclined downward toward a periphery thereof from the first fluid hole, the supercritical fluid flowing along the first guide portion,
wherein the lower vessel further includes a second guide portion provided at an upper portion thereof to be gradually inclined upward toward a periphery thereof from the second fluid hole, the supercritical fluid flowing along the second guide portion,
wherein the first fluid hole is vertically aligned with the second fluid hole,
wherein the lower surface of the upper vessel includes a first lower horizontal surface, a second lower horizontal surface, and a vertical side surface connecting the first horizontal lower surface to the second lower horizontal surface,
wherein the second lower horizontal surface of the upper vessel is lower than the first lower horizontal surface of the upper vessel,
wherein a portion of an interior surface of the upper and lower vessels that are engaged with each other is an uppermost upper horizontal surface of the lower vessel and is lower than the second lower horizontal surface of the upper vessel,
wherein the first lower horizontal surface, the second lower horizontal surface and the vertical side surface connected with other to form a first stepped portion of the upper vessel, and
wherein when viewed in a plan view, the vertical side surface is located outside of a periphery of the substrate.

* * * * *